United States Patent
Wiesbauer et al.

(10) Patent No.: US 9,106,211 B2
(45) Date of Patent: Aug. 11, 2015

(54) SYSTEM AND METHOD FOR AN OVERSAMPLED DATA CONVERTER

(71) Applicant: Infineon Technologies Austria AG, Villach (AT)

(72) Inventors: Andreas Wiesbauer, Poertschach (AT); Dietmar Straeussnigg, Villach (AT); Luis Hernandez, Madrid (ES); Fernando Cardes, Madrid (ES)

(73) Assignee: Infineon Technologies Austria AG, Villach (AT)

( * ) Notice: Subject to any disclaimer, the term of this patent is extended or adjusted under 35 U.S.C. 154(b) by 298 days.

(21) Appl. No.: 13/799,805

(22) Filed: Mar. 13, 2013

(65) Prior Publication Data

US 2014/0270261 A1    Sep. 18, 2014

(51) Int. Cl.
| | |
|---|---|
| H03M 1/60 | (2006.01) |
| H03M 1/12 | (2006.01) |
| H03K 3/00 | (2006.01) |
| H04R 3/00 | (2006.01) |
| H03K 3/012 | (2006.01) |
| H03K 3/0231 | (2006.01) |

(52) U.S. Cl.
CPC ............... *H03K 3/012* (2013.01); *H03M 1/12* (2013.01); *H03M 1/60* (2013.01); *H03K 3/0231* (2013.01); *H04R 3/00* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 6,928,173 B2 | 8/2005 | Akino | |
| 8,542,138 B2 * | 9/2013 | Galton et al. | 341/118 |
| 8,742,970 B2 * | 6/2014 | Lesso et al. | 341/157 |
| 2009/0232339 A1 | 9/2009 | Motobayashi et al. | |
| 2011/0176692 A1 | 7/2011 | Staat | |

OTHER PUBLICATIONS

Park et al., A 78 dB SNDR 87 mW 20 MHz Bandwidth Continuous-Time Delta Sigma ADC With VCO-Based Integrator and Quantizer Implemented in 0.13 micrometer CMOS, IEEE Journal of Solid-State Circuits, vol. 44. No. 12 (2009), pp. 3344-3358. © 2009 Institute of Electrical and Electronics Engineers.*

Gontier, David, et al., "Sampling Based on Timing: Time Encoding Machines on Shift-Invariant Subspaces," Applied and Computational Harmonic Analysis, Jan. 8, 2013, 21 pages.

Hansen, Sean T., et al., "Wideband Micromachined Capacitive Microphones with Radio Frequency Detection," J. Acoust. Soc. Am., 116, (2), Aug. 2004, pp. 828-842.

Soell, S. "Theory and Applications of Delta-Sigma Analogue-To-Digital Converters Without Negative Feedback," Thesis presented to the Academic Faculty of the Department of Electronics and Electrical Engineering, University of Glasgow in fulfillment of the requirements for the Degree Doctor of Philosophy, Jun. 2008, pp. i-134.

* cited by examiner

*Primary Examiner* — Howard Williams
(74) *Attorney, Agent, or Firm* — Slater & Matsil, L.L.P.

(57) ABSTRACT

In accordance with an embodiment, a circuit includes an oscillator having an oscillation frequency dependent on an input signal, a digital accumulator having a first input coupled to an output of the oscillator, a digital-to-analog converter (DAC) coupled to an output of the digital accumulator, an analog loop filter coupled to an output of the digital-to-analog converter, and a comparison circuit having an input coupled to an output of the analog loop filter and an output coupled to a second input of the digital accumulator.

34 Claims, 15 Drawing Sheets

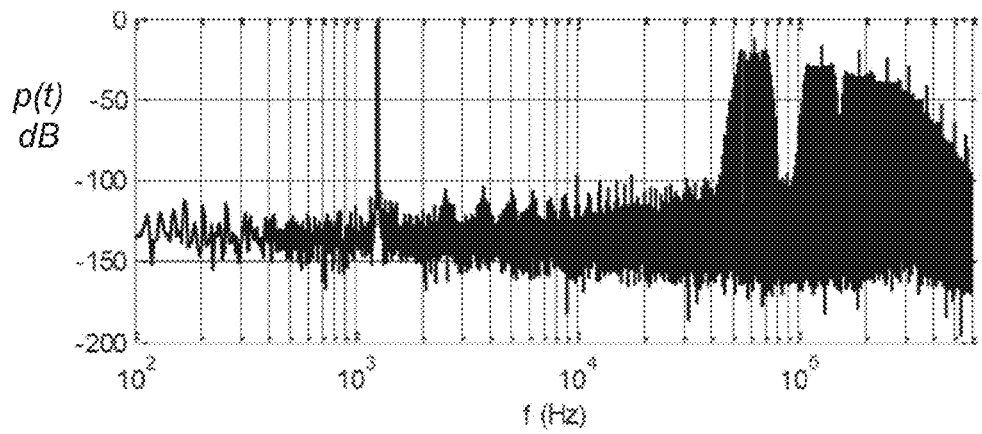
FIG. 3b
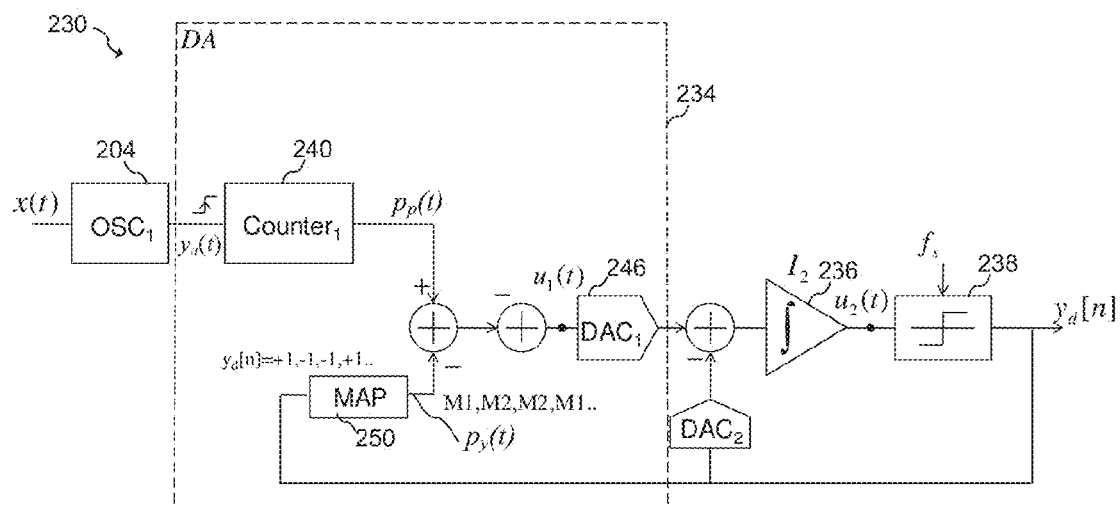
FIG. 4a
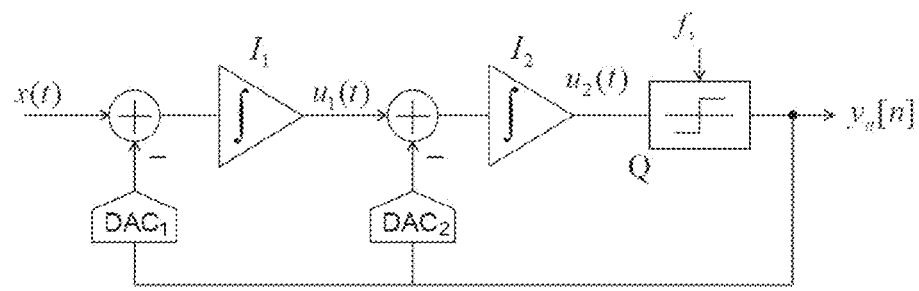
Prior Art    FIG. 4b

FIG 15b

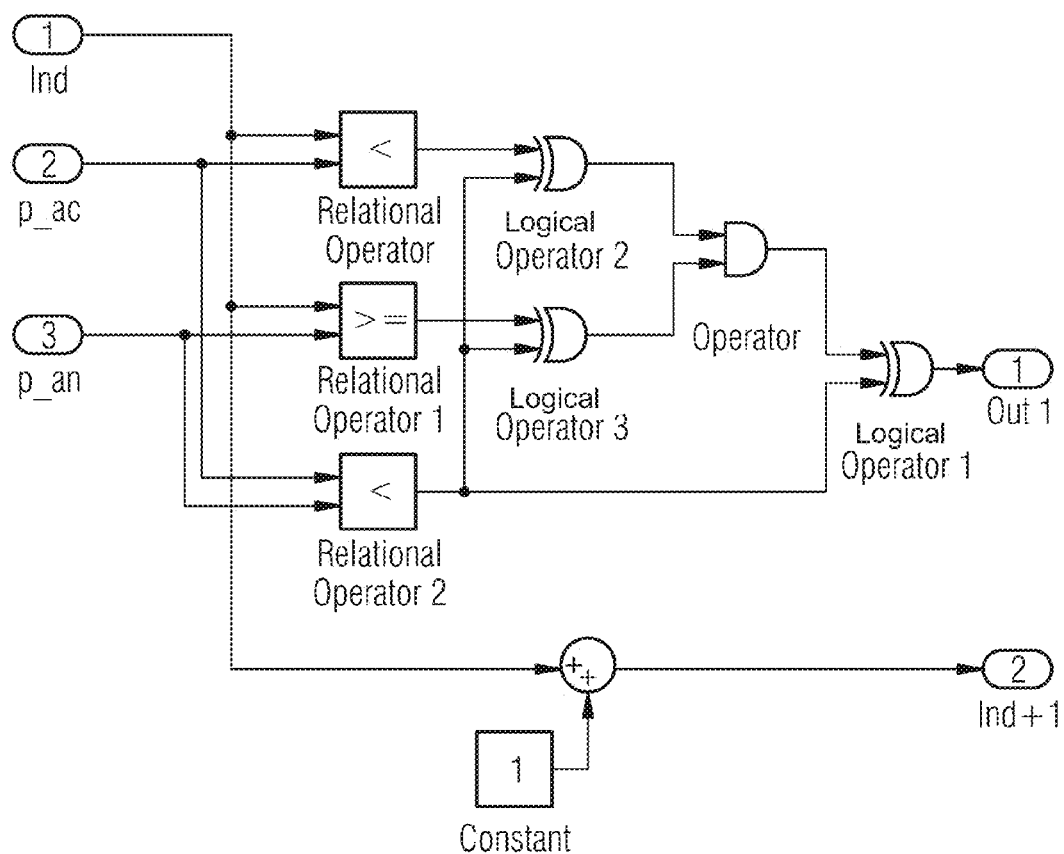

SYSTEM AND METHOD FOR AN OVERSAMPLED DATA CONVERTER

TECHNICAL FIELD

This invention relates generally to semiconductor circuits and methods, and more particularly to a system and method for an oversampled data converter.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

In applications where MEMS microphones are implemented in small form factor packages such as smartphones or tablet computers, the MEMS microphone is typically coupled to an integrated circuit that biases the MEMS microphone, amplifies the output of the MEMS microphone, and performs and analog-to-digital conversion on the electrical output of the MEMS microphone. Each of these functions consumes power and may consume valuable chip and/or board area. It is also the case, however, that small form factor applications are often low power, battery operated devices that are sensitive to power consumption. In order to maintain a long battery life, the power consumption of the MEMS microphone, its board level audio interface, and the size of its electrical components is minimized in order to conserve battery life and maintain a small form factor.

SUMMARY OF THE INVENTION

In accordance with an embodiment, a circuit includes an oscillator having an oscillation frequency dependent on an input signal, a digital accumulator having a first input coupled to an output of the oscillator, a digital-to-analog converter (DAC) coupled to an output of the digital accumulator, an analog loop filter coupled to an output of the digital-to-analog converter, and a comparison circuit having an input coupled to an output of the analog loop filter and an output coupled to a second input of the digital accumulator.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a-b illustrates a block diagram of an embodiment phase referenced integrator and an associated spectral plot;

FIG. 4a-b illustrates an embodiment data converter, and FIG. 4b illustrates a conventional data converter;

FIG. 7b illustrates an embodiment subtraction cell, and FIG. 7c illustrates an embodiment counter;

FIGS. 15a-e illustrate schematics of an embodiment data converter circuit; and

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an oversampled data conversion system and method for a capacitive signal source such as a MEMS sensor or microphone, and capacitive sensors such as pressure sensors and accelerometers. The invention may also be applied, however, to other types of circuits and systems, such as oscillator based sensors (R, L, C), audio systems, communication systems, sensor systems and other systems that interface to frequency coded signals.

In an embodiment, an oscillator is used as an initial integrator of a sigma delta modulator, and a continuous time loop filter is used after the oscillator in order to achieve a loop order and the corresponding noise shaping of any degree. In some embodiments, digital asynchronous logic is used that have inherently noise shaped errors and non-idealities.

The discussion of embodiments of the present invention begins by first analyzing the spectrum of the output of an oscillator when it is transformed into a Pulse Density Modulation (PDM) and no sampling is performed. Next, an embodiment integrator that utilizes an embedded PDM encoder having an asynchronous counter, is described, as well as how to use such an embodiment integrator along with an analog loop filter to implement a high order sigma delta modulator. Finally, systems in which embodiment sigma delta modulators are configured to be coupled to capacitive microphones and sensors are described.

Figure 1:
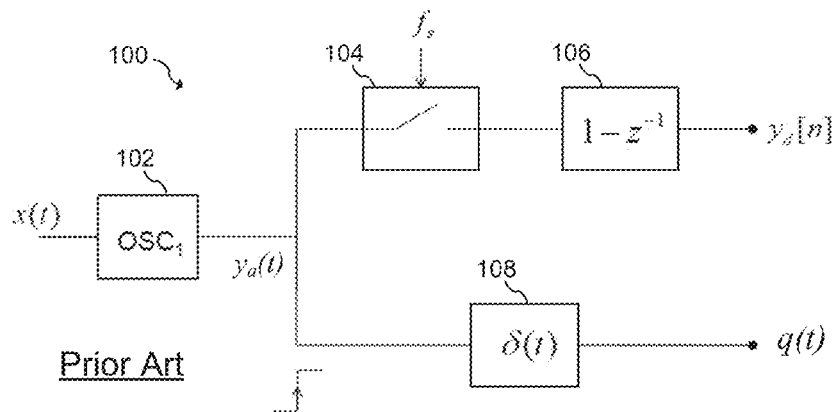
FIG. 1 illustrates a conventional configuration of a 1st order oscillator-based sigma delta modulator.

FIG. 1 depicts a conventional configuration of a 1st order oscillator-based sigma delta modulator 100 in which input signal x(t) modulates the frequency of an oscillator 102. Signal x(t) may be a voltage, as in the case of a VCO, or a reactance change in a capacitive or inductive sensor. The phase of the oscillator, Φ(t), is proportional to the integral of x(t), and edges of the oscillator square wave output, $y_a(t)$ represent the crossings of Φ(t) over 2π multiplies. If $f_0$ is defined as the oscillation frequency at rest and Δf is defined as the maximum frequency shift, the phase signal is:

$$\Phi(t) = \int_0^t (2\pi f_o + 2\pi \Delta f \cdot x(\tau)) d\tau = 2\pi f_o t + 2\pi \Delta f \int_0^t x(\tau) d\tau \quad (1)$$

In FIG. 1, signal $y_a(t)$, is latched at a sampling rate $f_s$ using sampler 104 and differentiated using differentiator 106 to produce a single bit, first order, noise shaped output $y_d[n]$. If, instead of sampling, a Dirac delta function is generated with each rising edge of $y_a(t)$ using block 108, and signal q(t) is obtained:

$$q(t) = \sum_{k=0}^{\infty} \delta(t - t_k), S = \{t_k / \Phi(t_k) = 2k\pi, k = 0, 1, \ldots \infty\}. \quad (2)$$

Signal q(t) accords with the definition of an integrating Time Encoding Machine (TEM) described in *Sampling based on timing: Time encoding machines on shift-invariant Subspaces*, by Gontier, et al., arXiv:1108.3149, which proves, under some conditions, that x(t) may be perfectly reconstructed using only the timing information provided in the sampling set S. The decoding algorithm proposed by Gontier is of a recursive nature. If x(t) has a finite bandwidth B, the spectrum of q(t) contains x(t) and a modulated tone appears at the oscillation frequency. Provided that the oscillating frequency at rest $f_0$ and the frequency deviation Δf of the oscillator 102 complies with certain restrictions, an approximation of x(t) may be recovered using a low pass filter. A condition that permits reconstruction of x(t) described by Gontier is that the density of the sampling set S of equation (2) is at least equal to 2 B, the Nyquist sampling rate for x(t). Then, a sufficient sampling density in q(t) may be ensured by the following condition:

$$t_{k+1} - t_k \leq \frac{1}{2B}, f_o - \Delta f \geq 2B. \quad (3)$$

Figure 2:
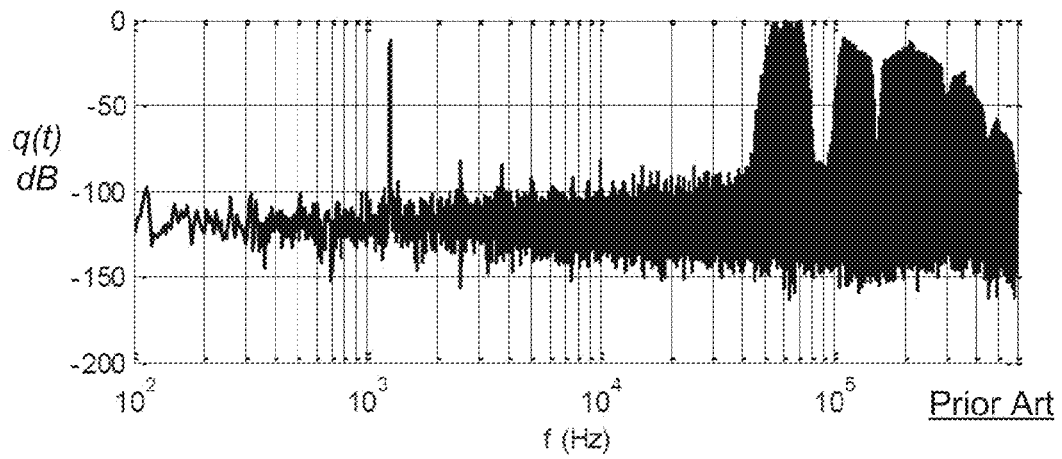
FIG. 2 illustrates a spectral output of a conventional 1st order oscillator-based sigma delta modulator.

FIG. 2 shows the spectrum of q(t) when a sine wave of 1.2 KHz at an amplitude of −6 dBfs is applied to oscillator 102 of FIG. 1, such that f=60 KHz and Δf=20 KHz. It can be seen that x(t) may be extracted from q(t) by low pass filtering, as the sidebands of the modulated oscillation at $f_0$ are separated from x(t). These sidebands are composed of tones around the oscillation frequency that are highly attenuated close to the input signal. It should be noted that no quantization has been carried out at q(t), as a difference with signal $y_d[n]$ is of discrete amplitude, but not quantized in time (sampled). In some embodiments, q(t) may be viewed as a Pulse Density Modulated (PDM) signal.

If signal q(t) is integrated using a continuous time integrator, each Dirac delta present in q(t) will result into a unit step function shifted to $t_k$. The resulting signal p(t) is:

$$p(t) = \int_0^t q(\tau) d\tau = \sum_{k=0}^{M} u(t - t_k) \approx \Phi(t), t_M < t < t_{M+1} \quad (4)$$

$$p(t_k) = 2\pi G\left(f_o t_k + \Delta f \int_0^{t_k} x(\tau) d\tau\right).$$

Given the linearity of the integration function (4) and the frequency separation between the modulated oscillation in q(t) and the baseband signal x(t), it may be expected that p(t) also contains an accurate approximation to the integral of x(t) except for a gain factor GΔf and a linearly growing factor with time Gf₀t. Hence, p(t) is an approximation of Φ(t).

Figure 3A:
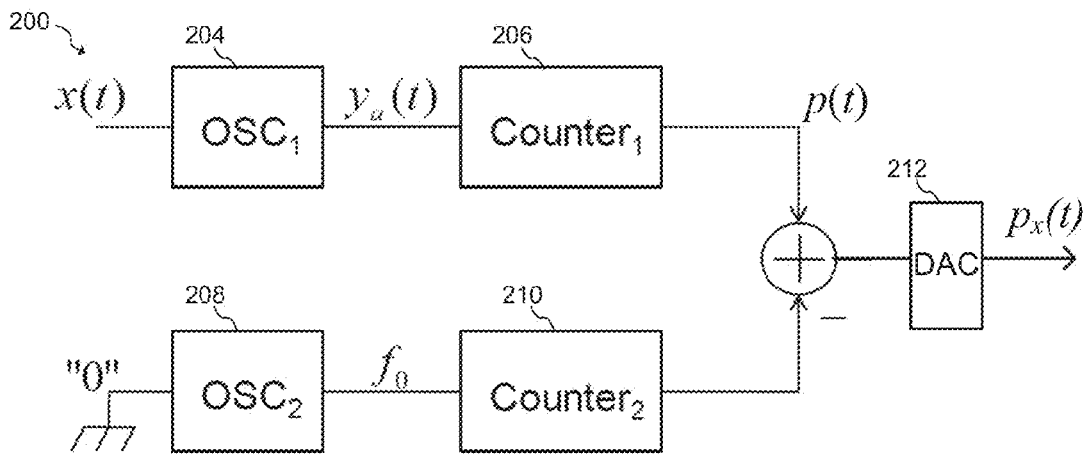

FIG. 3a illustrates embodiment phase referenced integrator 200 that may be used to generate p(t). In this example, signal p(t) is generated without physically generating q(t). Rather, pulses in signal $y_a(t)$ produced by oscillator 204 are counted with digital counter 206 to produce p(t). FIG. 3b illustrates a spectrum of p(t). To generate signal $p_x(t)$ proportional to the integral of x(t), the linear component that appears in the phase signal of equation (4) is compensated by subtracting the output of the count of second counter 210 clocked with fixed frequency $f_0$ produced by oscillator 208. The output of this subtraction is converted into the analog domain using DAC 212 to form signal $p_x(t)$. Note that in this system, output signal $p_x(t)$ is a continuous time signal based on discrete values that change asynchronously.

In an embodiment, phase referenced integrator 200 may be incorporated as the first stage of a continuous time sigma delta modulator of any order, as shown in FIG. 4a that illustrates an embodiment data converter 230. Data converter 230 includes oscillator 204, data accumulator (DA) 234, analog integrator 236 and comparator 238. Counter 240 and DAC 246 within data accumulator 234 function as a first integrator of data converter 230, and state variable $u_1(t)$ is obtained by subtracting from the output of counter 240 two possible values M1 and M2 representing the number of cycles generated by oscillator 204 in a sampling period Ts when x(t) has its maximum and minimum values respectively:

$$M_1 = (f_o + \Delta f)/f_s, M_2 = (f_o - \Delta f)/f_s \quad (5)$$

The subtracted amount $p_y(t)$ depends on the value of the last quantized sample $y_d[n]$ through a mapping function MAP 250. For instance, for a single bit sigma delta modulator, MAP 250 will assign during the sampling period n values $p_y(t)$=M1 if yd[n]=+1; and $p_y(t)$=M2 if yd[n]=−1. By partitioning analog components such as integrator 236 and comparator 238 to be coupled after DA 234, error induced by analog circuits may be spectrally shaped by the loop. In alternative embodiments, feedback signal $y_d[n]$ may be applied to the input of oscillator 204, such that $y_d[n]$ is subtracted from x(t) in the analog domain.

Figure 5A:
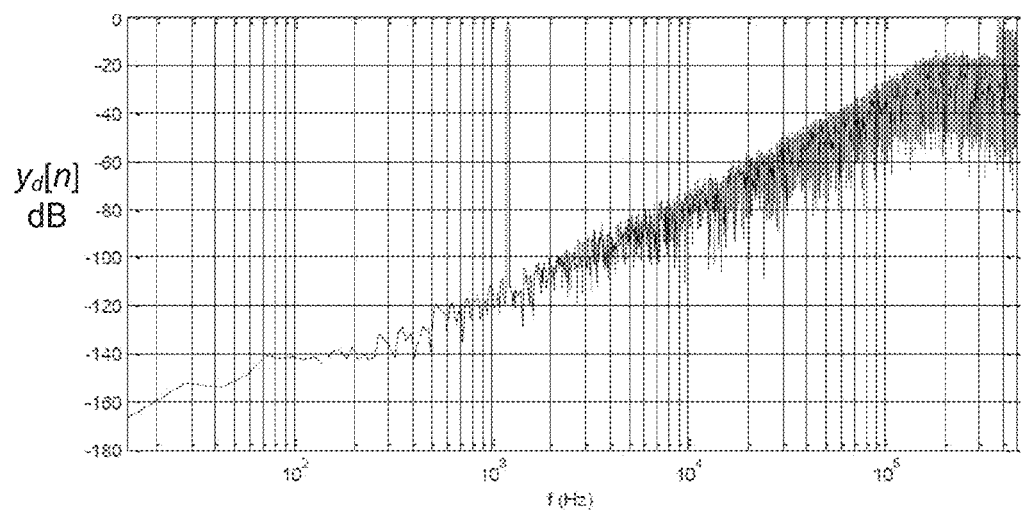
FIGS. 5a-b illustrate spectral plots of outputs of an embodiment data converter and a conventional data converter.
Figure 5B:
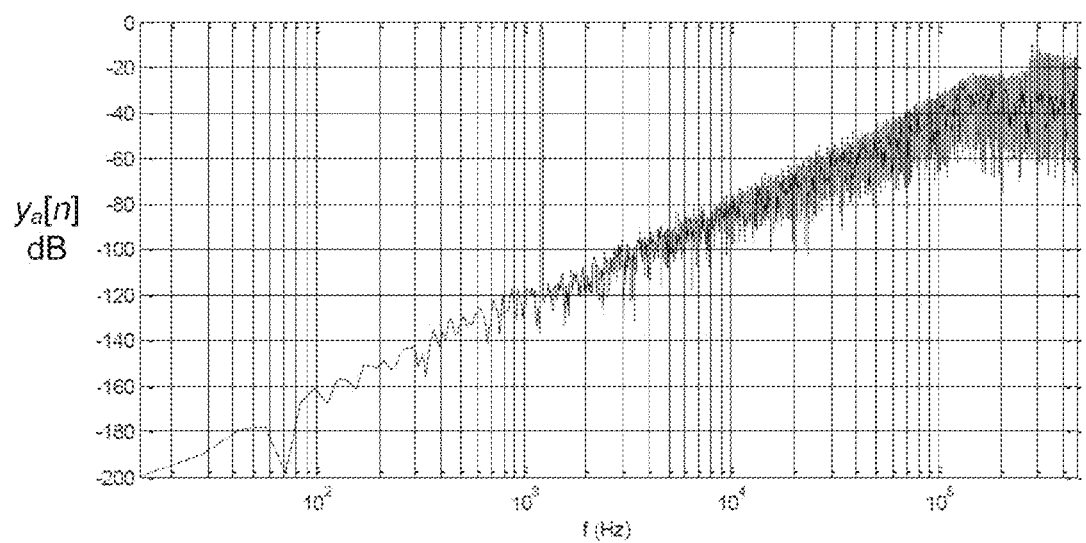

FIG. 5a illustrates a FFT of a behavioral simulation of output $y_d[n]$ of embodiment data converter 230 depicted in FIG. 4a, and FIG. 5b illustrates a FFT of output $y_a[n]$ of a behavioral simulation of conventional second order sigma delta modulator depicted in FIG. 4b. For the purpose of comparison, parameters M1, M2, $f_0$ and Δf in embodiment data converter 230 have been adjusted to reproduce the same integrator gains and reference currents used in the conventional second order sigma delta modulator depicted in FIG. 4b. An input tone of −8 dBfs and an oversampling ratio of 128 are used for both behavioral simulations. The resulting SNR obtained for the two simulations is 88 dB for the embodiment data converter and 92 dB for the conventional converter.

Figure 6:
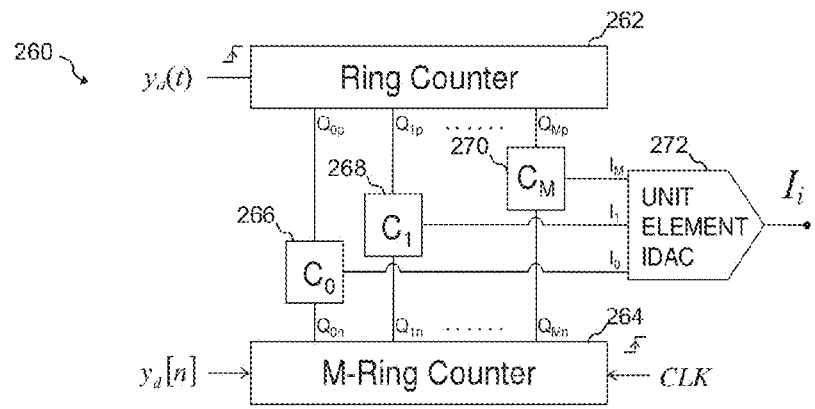
FIG. 6 illustrates a block diagram of an embodiment data accumulator.

In an embodiment, DA 234 shown in FIG. 4a may be alternatively implemented as DA 260 illustrated in FIG. 6, in which the whole counting function is implemented in a single circuit. In some embodiments, the structure of DA 260 reduces the nonlinearity introduced by mismatches in DAC 246 and timing glitches due to the clockless operation of the DAC 246 (FIG. 4a).

In this implementation, two separate ring counters 262 and 264 having N stages each, count with the rising edges of inputs $y_a(t)$ and the sampling clock CLK. Counter 262 advances one position for each rising edge of $y_a(t)$, and counter 264 advances M1 or M2 positions for each rising edge in CLK depending on the value of $y_d[n]$. For this reason, counter 262 is designated as an M-modulus ring counter. Outputs Qp and Qn reproduce the values of the counters 262 and 264 using a thermometric code. To produce the desired output code in $u_1(t)$ (See FIG. 4a) both thermometric codes are subtracted using subtraction cells 266 and 268 to 270 that digitally subtract corresponding bit outputs from each ring counter 262 and 264. The outputs of subtraction cells 266 and 268 to 270 are converted from the digital domain to the analog domain using unit element current digital-to-analog converter (IDAC) 272.

Figure 7A:
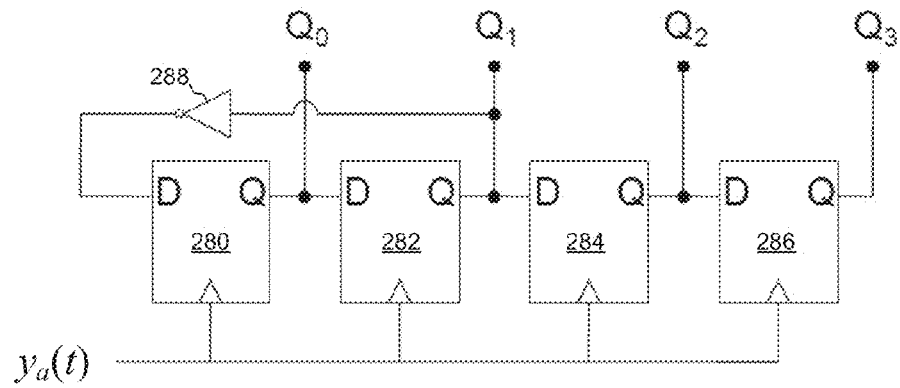
FIGS. 7a-c illustrates an embodiment ring counter.

FIG. 7a illustrates the internal circuitry of ring counter 262 of FIG. 6. In the depicted embodiment, four stages (N=4) of registers 280, 282, 284 and 286 are shown, however, in alternative embodiments greater or fewer stages may be used. Inverter 288 provides feedback from middle tap of the ring counter to register 280 to ensure a periodic change of logic level in each output Qi with a period of N pulses in $y_a(t)$. In comparison, a typical Johnson counter produces signals with a period of 2N cycles. FIG. 7c illustrates the internal circuitry of M-modulus ring counter 264. A digital accumulator is increased by constants M1 and M2 at each active edge of the sampling clock CLK depending on the value of yd[n]. The generated value is decoded in a pointer decoding block to switch on the required Qn outputs in 264.

Figure 7B:
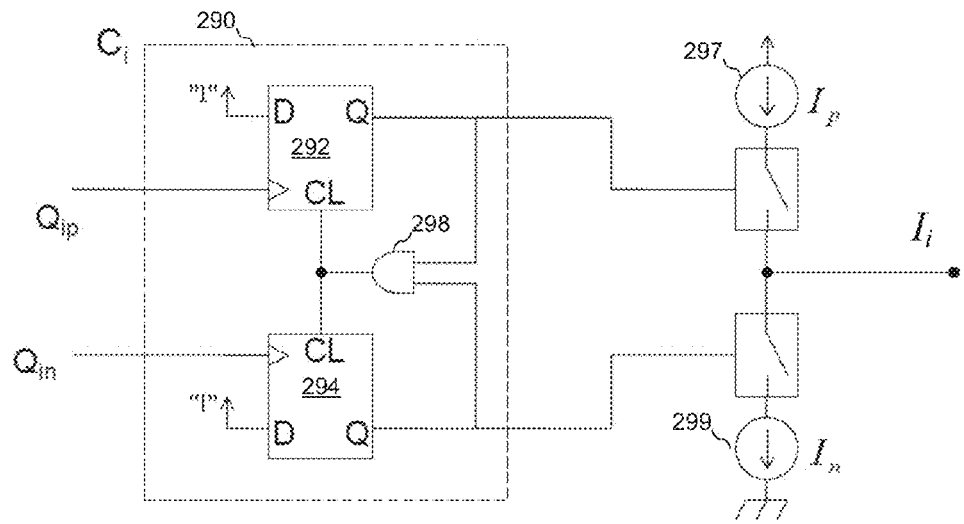
Figure 7C:
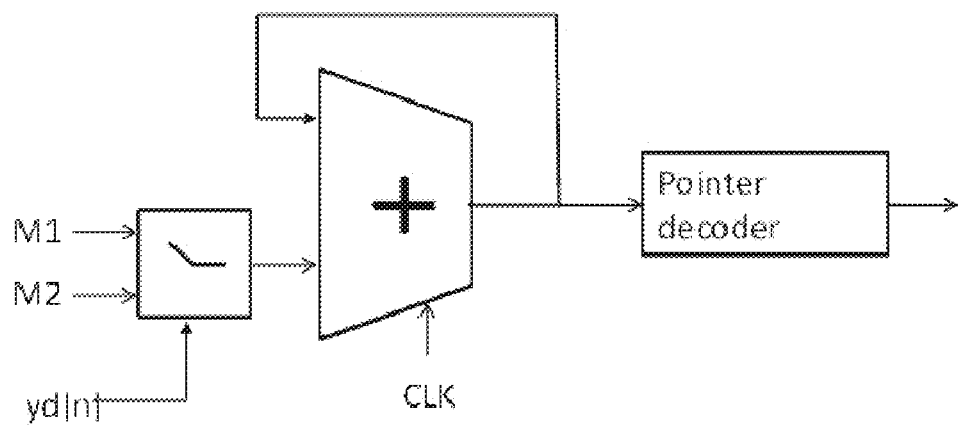

FIG. 7b illustrates embodiment subtraction cell 290 coupled to a unit DAC element. In an embodiment, subtraction cell 290 may be used to implement subtraction cells 266 to 270 shown in FIG. 6. Subtraction cell 290 includes a phase-frequency detector that includes AND gate 298 and registers 292 and 294. When the i-th positive Q signal is triggered, positive current element 297 is switched in the IDAC. Afterwards, if the i-th negative Q signal is triggered, element 297 is reset. The operation is similar if it is the negative Q signal that triggers first, except that a negative current element 299 is triggered and then reset.

In an embodiment, the operation of subtraction cell 290 allows counter 240 and MAP block 250 (FIG. 4a) to keep operating while the difference between the outputs of counter 240 and MAP block 250 are within ±N units. A failure to comply with this condition is equivalent to the saturation of an operational amplifier due to the over range in one of the state variables. In some embodiments, the state variables of the data converter are sized to ensure that this equivalent saturation condition is not produced. Alternatively, a specific saturation detector circuit may be used to detect saturation. In some embodiments, the sizing of state variables dictates the length N of ring counters of the ring counters N 262 and 264 (FIG. 6).

The circuit of FIG. 6 may be subjected to two types of circuit induced errors. A first type of circuit induced error is nonlinearity due to mismatch between element current sources 297 and 299 in IDAC 272. A second type of circuit induced error is due to glitches in the switching of the current cells, which is not related to any clock. However, the rotating operation of the ring counters 262 and 264 ensure that the current element cells of the IDAC 272 are addressed in a circular fashion.

Figure 8:
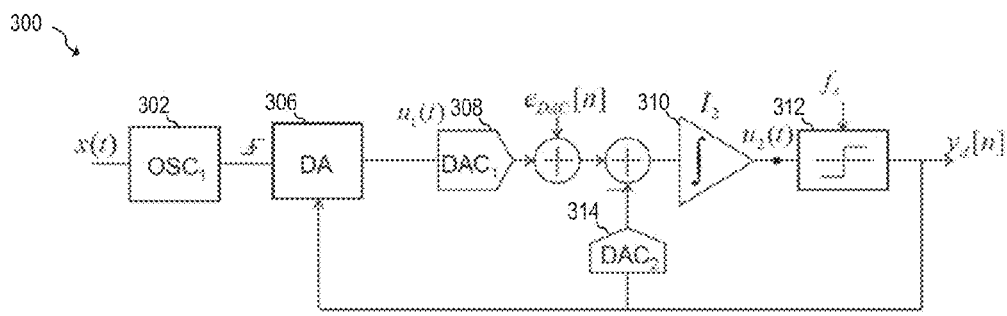
FIG. 8 illustrates a circuit error model of an embodiment data converter.

FIG. 8 illustrates circuit error model 300 of an embodiment data converter that has oscillator 302, DA circuit 306, DAC 308, feedback DAC 314, analog integrator 310 and comparator 312. Errors introduced in DAC 308 may be modeled as additive error signal $e_{DAC}[n]$ added at its output. Given that $e_{DAC}[n]$ is introduced the input of the second analog integrator 310, the effect of this error is first order noise shaped.

Figure 9:
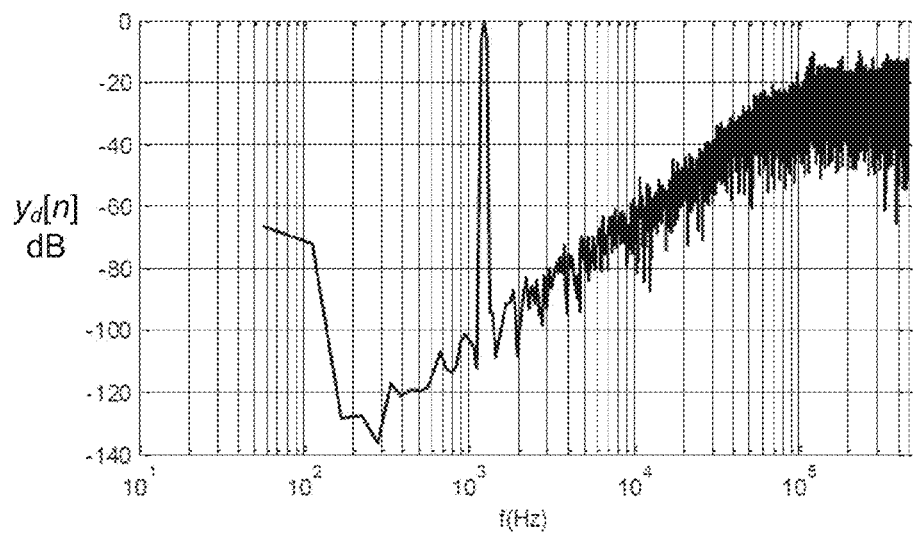
FIG. 9 illustrates a spectral plot of an output of an embodiment data converter in which DAC mismatch is modeled

FIG. 9 illustrates a FFT of a behavioral simulation of output $y_d[n]$ of embodiment data converter 230 depicted in FIG. 4a in which a normally distributed random error of 1% of the unit element nominal value in the positive and negative current elements 297 and 299 are modeled. The resulting SNR is 84 dB, which is only 4 dB below the reference case of FIG. 5a shown above.

Figure 10:
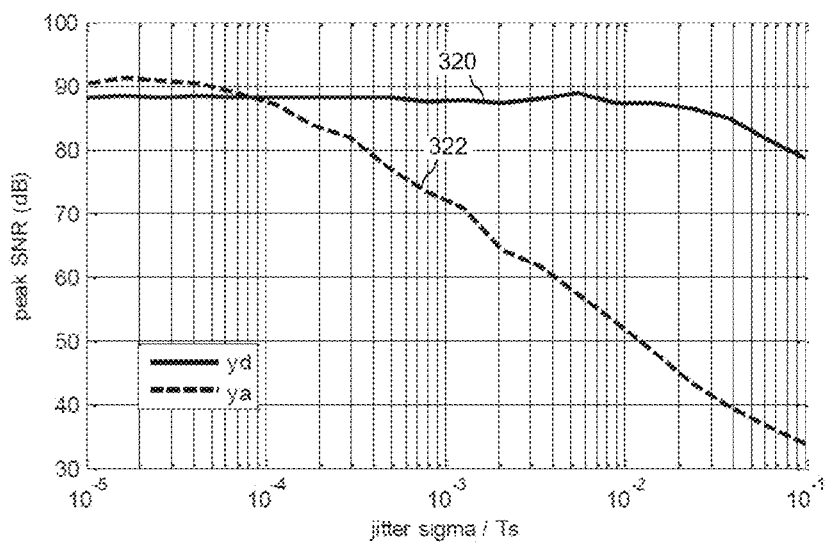
FIG. 10 illustrates a plot comparing peak SNR with respect to jitter variation for an embodiment data converter and a conventional data converter.

Conventional continuous time sigma delta modulators, such as the circuit shown in FIG. 4b, are known to be sensitive to clock jitter in the feedback DAC. In the circuit of FIG. 4b, DAC jitter can be modeled as an additive signal at the DAC2 output, which is integrated in integrator I1. In embodiment data converter 230, clock jitter is first order noise shaped because it can be modeled as an additive error at the output of DAC 246, and then follows the same error model as in FIG. 8. In this case, jitter error appears after the integration process has taken place in 234, therefore can be treated in the same way as DAC nonlinearity and error results spectrally shaped. FIG. 10 illustrates a simulated plot of peak SNR v. normalized clock jitter variance $\sigma/Ts$ for the embodiment implementation shown in FIG. 4a (trace 320), and for the conventional continuous time implementation shown in FIG. 4b (trace 322). In the simulation of the embodiment implementation of FIG. 4a, Gaussian white jitter is added to the clock that triggers MAP block 250 and also to the clock that triggers comparator 238. In one example, an embodiment system may withstand clock jitter variance up to 2% of the sampling period without having a significant SNR loss from the ideal value of 88 dB, while the standard modulator illustrated in FIG. 4b can only withstand a jitter variance of 0.1% of the sampling period. It should be understood that the actual performance of embodiment systems may vary according to the particular embodiment and its specifications.

Figure 11:
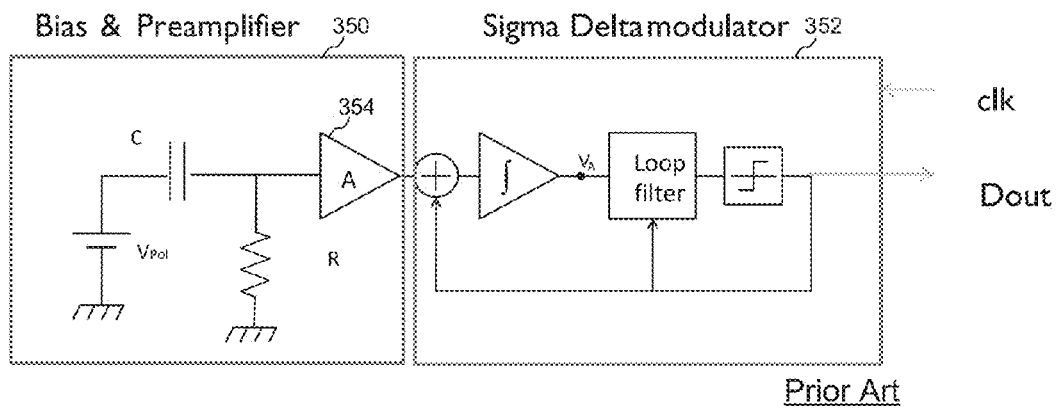
FIG. 11 illustrates a conventional microphone system.

FIG. 11 illustrates a conventional microphone system having bias and preamplifier block 350 followed by sigma-delta modulator block 352. Amplifier 354 buffers the output of a capacitive microphone represented as capacitor C. DC power supply $V_{Pol}$ provides a bias to the microphone. Sigma delta modulator 352 is coupled to the output of bias and preamplifier block 350 and is constructed, for example, using a conventional oversampled data converter architecture as shown in FIG. 4b.

Figure 12A:
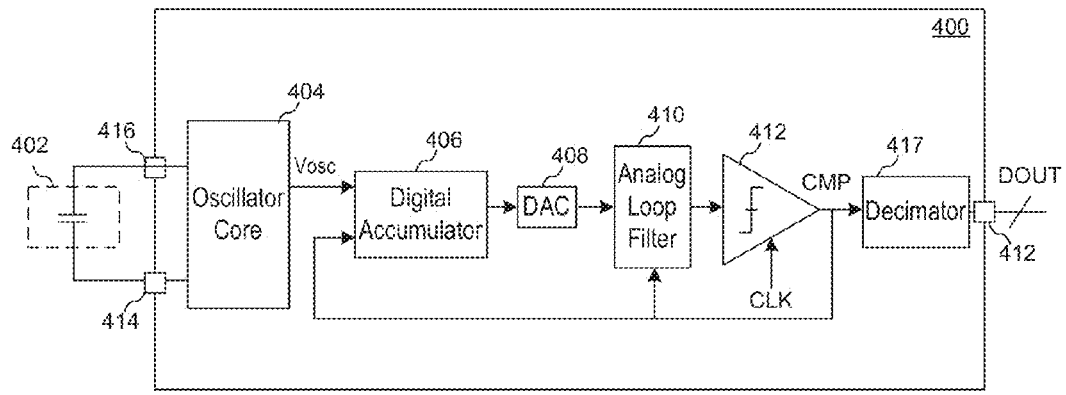
FIGS. 12a-b illustrate a block diagram of an embodiment microphone interface circuit.
Figure 12B:
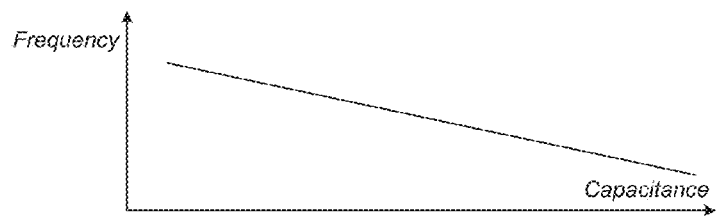

FIG. 12a illustrates embodiment integrated circuit (IC) 400 configured to be coupled to MEMS microphone 402, which is shown in dotted lines to indicate that microphone 402 is not necessarily included on IC 400. In some embodiments, however, microphone 402 may also be included on IC 400. In alternative embodiments, other types of capacitive sensor circuits may be used in place of MEMS microphone 402. Oscillator core 404 is coupled to MEMS microphone 402 via pins 414 and 416 and produces signal Vosc that has a frequency related to the capacitance of MEMS microphone 402. In one embodiment, oscillator core 404 is implemented using a relaxation oscillator in which the capacitance of MEMS microphone 402 is used as at least a part of the capacitance of the relaxation oscillator. Hence, the frequency of oscillation of signal Vosc is inversely proportional to the capacitance of MEMS microphone 402 as shown in FIG. 12b. During operation, the capacitance of MEMS 402 undergoes a corresponding change as sound energy causes the plates of MEMS microphone 402 to vibrate. This corresponding change in capacitance is then reflected in the phase and frequency of signal Vosc.

Turning back to FIG. 12a, digital accumulator (DA) 406 is configured to change state at each rising and or falling edge or of signal Vosc. In one example, digital accumulator 406 increments at the edges of signal Vosc. The output of digital accumulator 406 is converted into the digital domain by digital-to-analog converter 408, the output of which is introduced into analog loop filter 410. Comparator 412 then compares the output of analog loop filter 410 with a threshold. The comparison may be performed synchronously with fixed frequency clock signal CLK. Decimator 417 is coupled to the output of comparator 412, and provides digital output word DOUT using decimation techniques known in the art. In some embodiments, comparator 412 may be implemented using a multibit comparator, such as a multibit flash ADC. The feedback to digital accumulator 406 may be in the form of predefined constants in some embodiments.

Output CMP of comparator 412 is further coupled to an input of digital accumulator 406, which also adjusts it state depending on the value of CMP. For example, digital accumulator 406 decrements a constant value M1 when CMP is high, and decrements in another constant value M2 when CMP is low. In some embodiments, comparator 412 may be implemented using a multibit comparator that outputs various constant values, M1, M2, M3 . . . , one for each different value generated by comparator 412. In some cases, digital accumulator may asynchronously increment at the rising and/or falling edge of Vosc, and synchronously decrement at the rising and/or falling edge of fixed frequency clock signal CLK according to the value of signal CMP. In some embodiments, DA 406 may be implemented according to FIGS. 6 and 7a-b described hereinabove using ring counters and unit element IDACS.

Figure 13A:
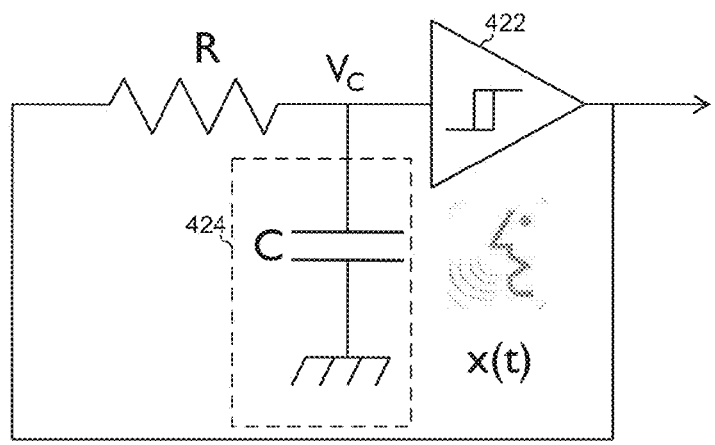
FIGS. 13a-c illustrate an embodiment oscillator core and waveform diagrams illustrating its operation.

FIG. 13a illustrates embodiment oscillator 420 having a core that includes resistor R and comparator 422 coupled to MEMS microphone 424 represented by capacitor C. MEMS microphone 424 is illustrated within dotted lines to show that MEMS microphone may physically separate from the oscillator core. It should be noted that input variable x(t) described in the embodiments above may represent sound energy in the case of some embodiments where a microphone capacitance is used to modulate the frequency of an oscillator.

Figure 13B:
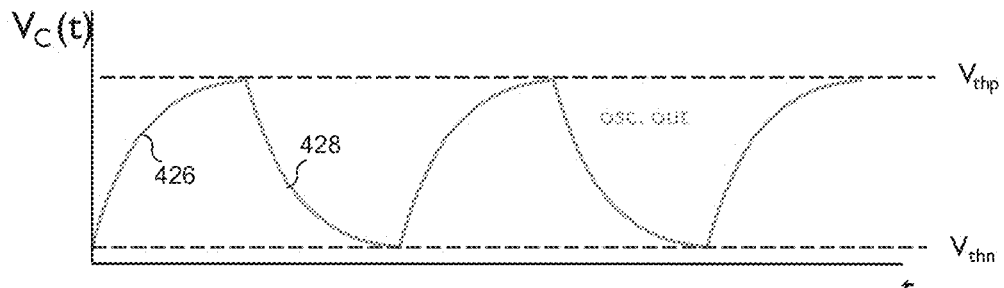

During operation, the output of comparator 422 charges MEMS capacitance C via resistor R until node $V_C$ reaches positive threshold Vthp of comparator 422. This charging phase is shown with respect to segment 426 in the waveform diagram of FIG. 13b. After the threshold of comparator 422 is reached, the output of comparator goes low, thereby discharging MEMS capacitance C until negative threshold Vthn is reached. This discharging phase is shown with respect to segment 428 in the waveform diagram of FIG. 13b.

Figure 13C:
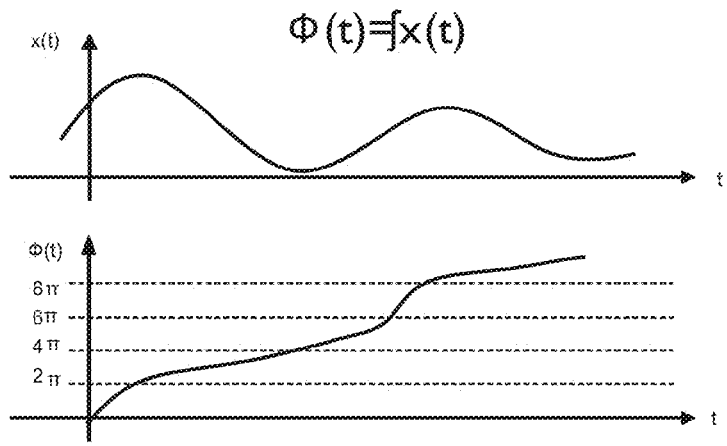

As capacitance C is modulated, the frequency of oscillator 420 changes such that the phase of the oscillator is integrated with respect to time. This relationship is illustrated in the waveform diagram of FIG. 13c that illustrates input variable x(t), which may be sound energy, and the output phase of the oscillator Φ(t), which is shown to be proportional to the integral of x(t).

Figure 14:
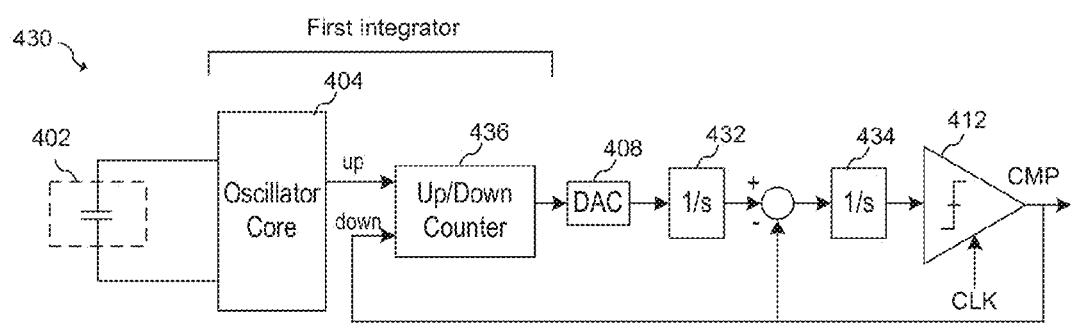
FIG. 14 illustrates a further embodiment data converter circuit.

FIG. 14 illustrates an embodiment data converter loop 430 in which up/down counter 436 is coupled to the outputs of oscillator core 404 and comparator 412. In an embodiment, up/down counter increments at the rising and/or falling edge of the oscillator, and decrements by a discrete set of values depending on output CMP of comparator 412. For example, in one embodiment, a first constant value may be subtracted when the output of comparator 412 is in a first state, and a second constant value may be subtracted when the output of comparator 412 is in a second state. The loop filter of converter loop 430 includes integrators 432 and 434. Because oscillator core 404 and counter 436 function together as a first integrator, data converter loop 430 effectively functions as a third order loop. In other embodiments, higher order loops may be implemented by adding additional integrators. For example, some microphone circuits may be interfaced to a fourth order data converter.

Figure 15A:
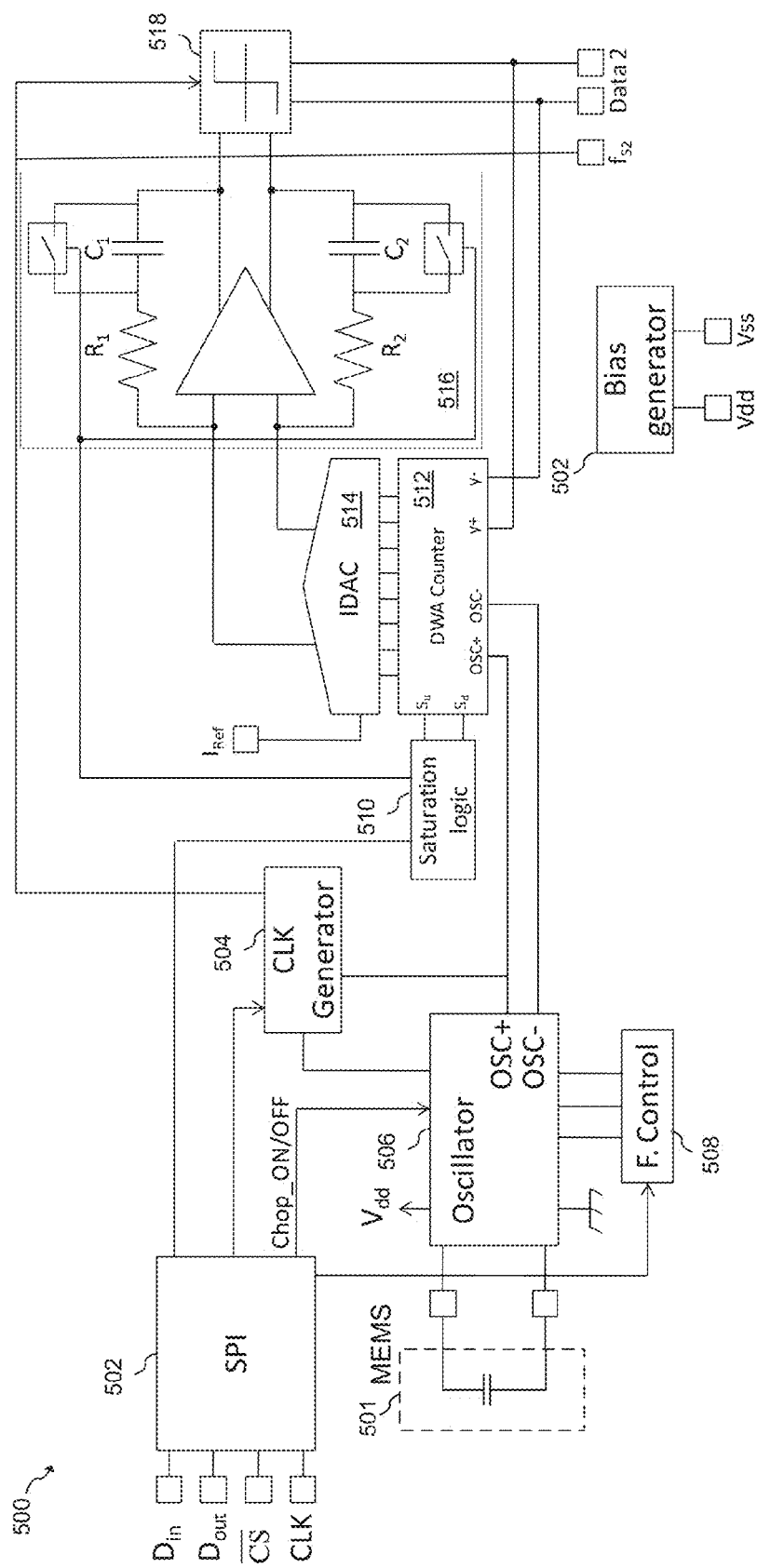

FIGS. 15a-e illustrate schematics of an embodiment integrated circuit configured to interface with a MEMS microphone or other capacitive signal source. FIG. 15A illustrates a top-level schematic of embodiment oversampled modulator integrated circuit 500. Integrated circuit 500 includes oscillator core 506 that is configured to be coupled to MEMS microphone 501. MEMS microphone 501 is illustrated in dotted lines to signify that MEMS microphone 501 is not necessarily on the same die as the other blocks of embodiment oversampled modulator integrated circuit 500. In an embodiment, the frequency of the output of oscillator core 506 is inversely proportional to the capacitance within MEMS microphone 501. The output of oscillator core 506 is coupled to the input of DWA counter 512. In an embodiment, DWA counter 512 operates according to the principles of the counter shown in FIG. 6 and described above. The output of counter 512 is coupled to IDAC 514 that feeds the input of analog integrator 516. Comparator 518 is coupled to analog integrator 516 and provides feedback to counter 512 according to a fixed frequency clock generated by clock generator 504, which is further interfaced to oscillator 506. In some embodiments, clock generator 504 is configured to produce a fixed clock having a frequency substantially equal to or close to an integer multiple of the average frequency of oscillator 506. In some embodiments, clock generator 504 may be implemented using a phase locked loop.

Frequency control block 508 may be used, for example, to adjust biasing or thresholds within oscillator 506. Adjusting the thresholds and or bias of oscillator core 506 may be used to set the center frequency, or to adjust the operation of oscillator 506 to be compatible with microphones of various capacitances. Saturation logic 510 monitors the state of the counters within counter 512. In one embodiment, if saturation logic 510 detects a saturation condition, the feedback capacitors in integrator 516 are bypassed. Bypassing the integrator capacitors effectively reduces the order of the loop, which may stabilize operation in various conditions, such as when oscillator 506 experiences a large input. In an embodiment, loop filter of the modulator is implemented using a single differential analog integrator 516. In alternative embodiments of the present invention, two or more integrators may be used in order to achieve higher loop orders. It should be understood that the architecture of analog integrator 516 is only one example of many example integrator structures. Other integrated structures and architectures known in the art may also be used. For example, second and successive integrators may be replaced by a VCO driven by a DAC and a further digital accumulator, as described below with respect to FIG. 16. In such embodiments, the use of analog integrators and opamps may be eliminated.

Digital interface 502 may be used to adjust the operation of the various elements within circuit 500. For example, digital interface 502 may be used to adjust the frequency control parameters controlled by frequency control block 508 as well as adjust the operation of clock generator 504 and saturation logic 510. In addition, signal Chop_ON/OFF may be used to compensate the flicker noise introduced in the oscillator circuitry by using chopping techniques known in the art, such as those used in audio and instrumentation amplifiers and comparators. Digital interface 502 may be implemented, for example, by using a serial peripheral interface (SPI). Alternatively, other parallel or serial digital interface circuits may be used. Moreover, outputs Data 2 from comparator 518 may be coupled to a digital decimation circuit to produce a multi-bit digital output word.

In an embodiment, oscillator 506 is configured to operate at a nominal frequency of between about 92 MHz and about 108 MHz, while comparator 518 is configured to compare the output of analog integrator 516 at a frequency of between about 10.24 MHz. When a bandwidth of about 20 KHz of the MEMS microphone is taken into consideration, circuit 500 effectively operates at and oversampling ratio of OSR=256. Alternatively, other frequencies and oversampling ratios may be implemented depending on the system and its particular specifications.

Figure 15B:
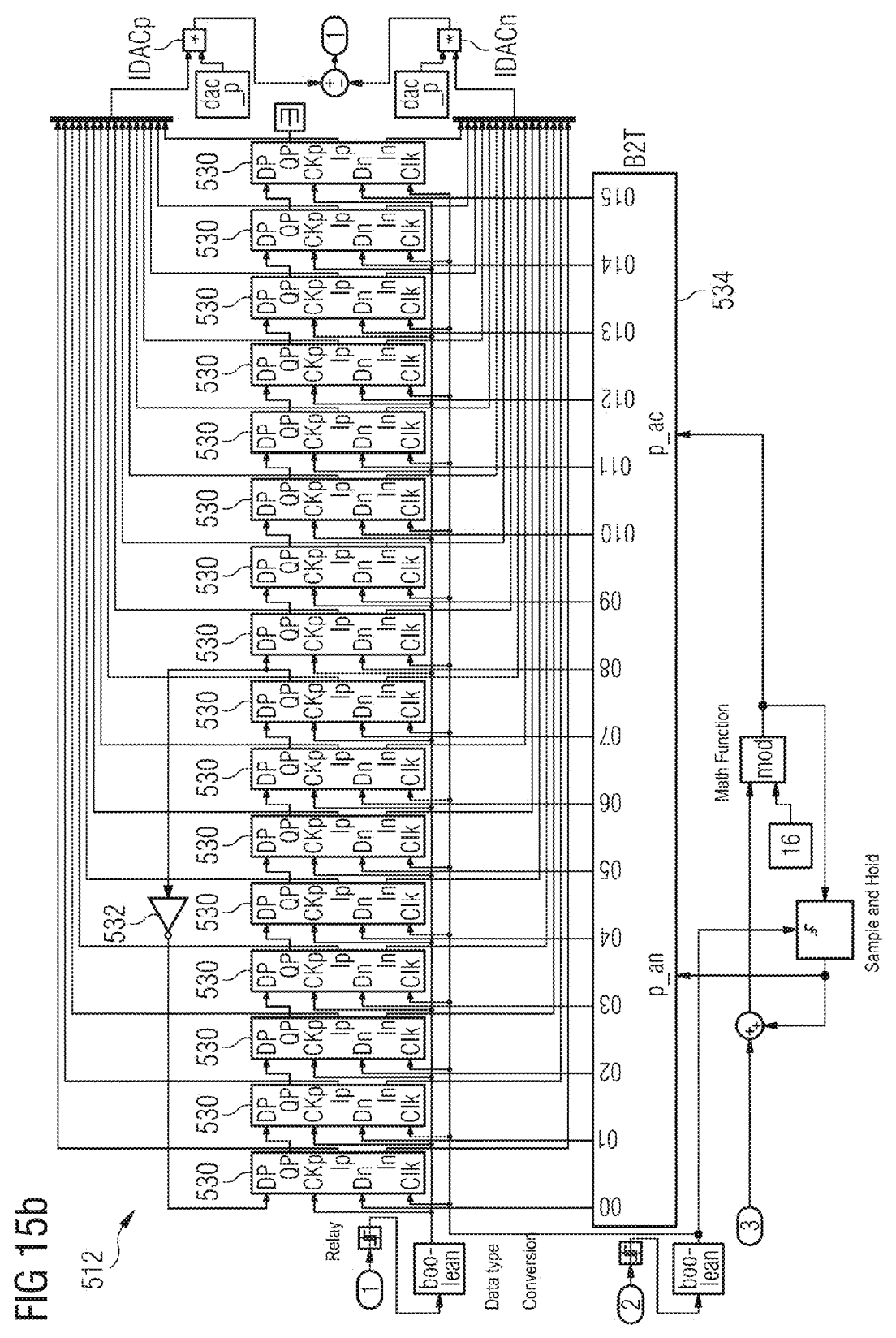

FIG. 15b illustrates a schematic of DWA counter 512 according to an embodiment of the present invention. Counter 512 includes one 16 bit ring counter (N=16) with feedback around the first 8 stages using logical operator 532. In some embodiments logical operator 532 may be implemented using, for example one or more digital inverters. The second ring counter may be implemented using a digital accumulator and the thermometric decoder 534, and physically implemented by cascading 16 bit-slice elements 530 that each contain registers to support a bit for each of the two counters, as well as subtraction circuitry such as that described with respect to FIG. 7b above. Decoder block 534 provides a feedback input word to one of the ring counters depending on the output of comparator 518. The IDAC is further functionally represented in FIG. 15b as IDACp and IDACn coupled to bit slice elements 530.

Figure 15C:
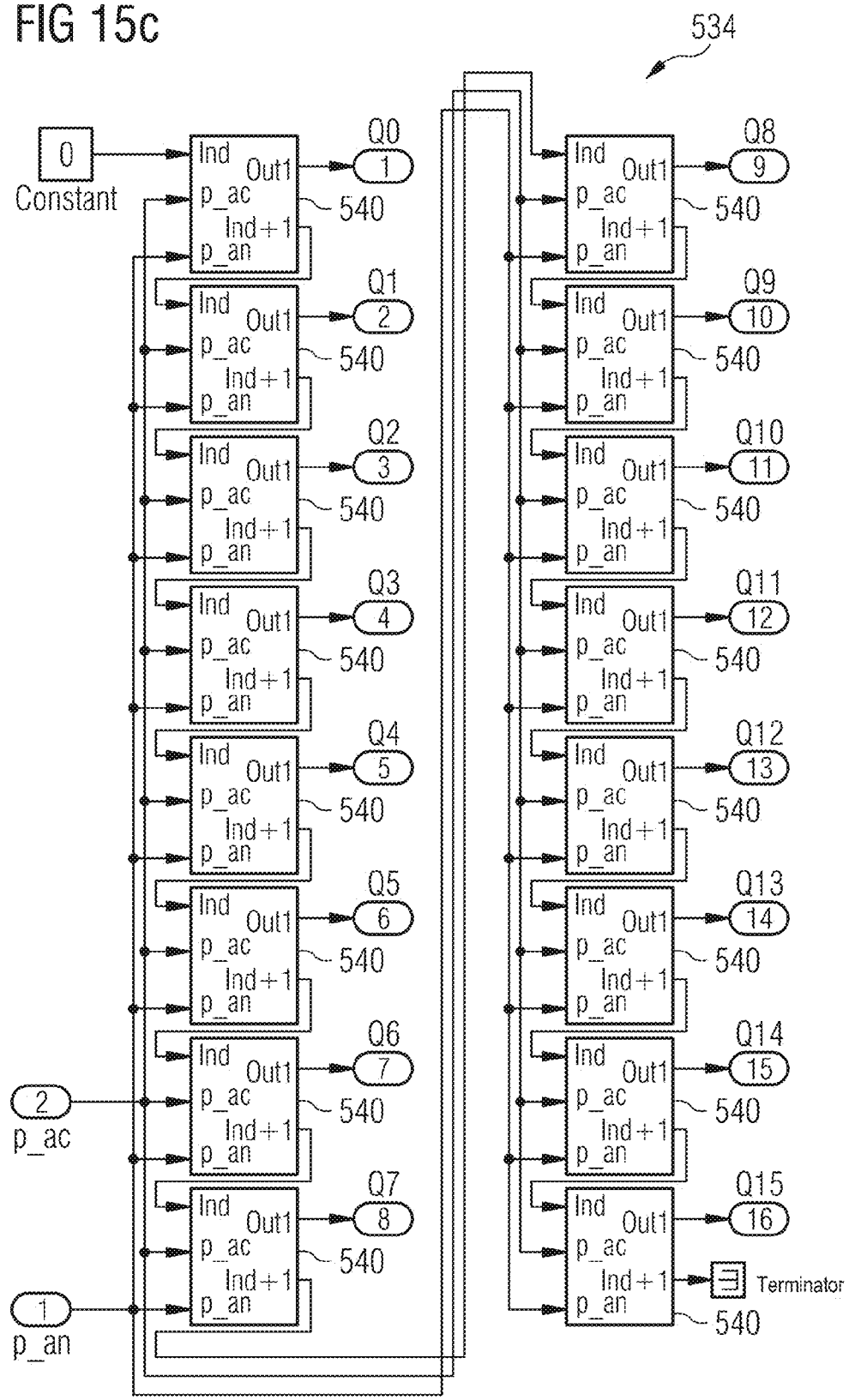

FIG. 15c illustrates a schematic of decoder block having 16 multiplier elements 540 that provide a scaled version of the comparator feedback to the ring counters. FIG. 15d illustrates a schematic of a decoder element using functional relational and logical operators. In embodiments of the present invention, these functional relational and logical operators may be implemented using various logic circuits known in the art.

Figure 15E:
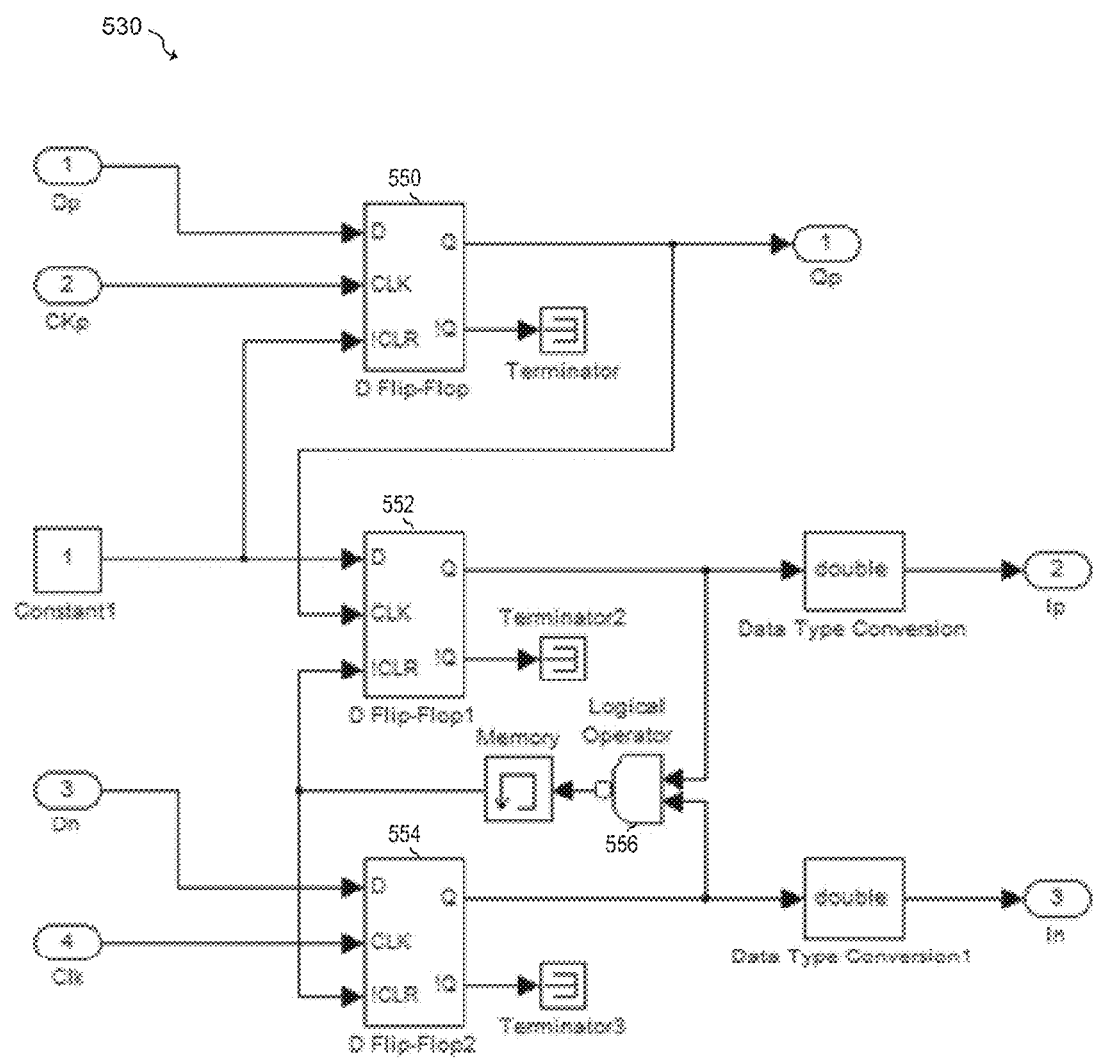

FIG. 15e illustrates a schematic of one instance of bit-slice element 530, which contains registers 550, 552 and 554. Register 550 functions as one register element of a ring counter that increments at each pulse of oscillator 506, while register 554 functions as one register element of the M modulus ring counter that changes according to the output of comparator 518. Both registers 552 and 554, as well as NAND gate 556 function as a subtraction circuit that provides output 1p to the positive IDAC elements and output 1n to negative DAC elements, as described with respect to the circuit of FIG. 7b described above. In the embodiment of FIG. 15e, however, register 554 performs a double duty functioning both as a ring counter bit element and as a part of the subtraction circuit.

Figure 16:
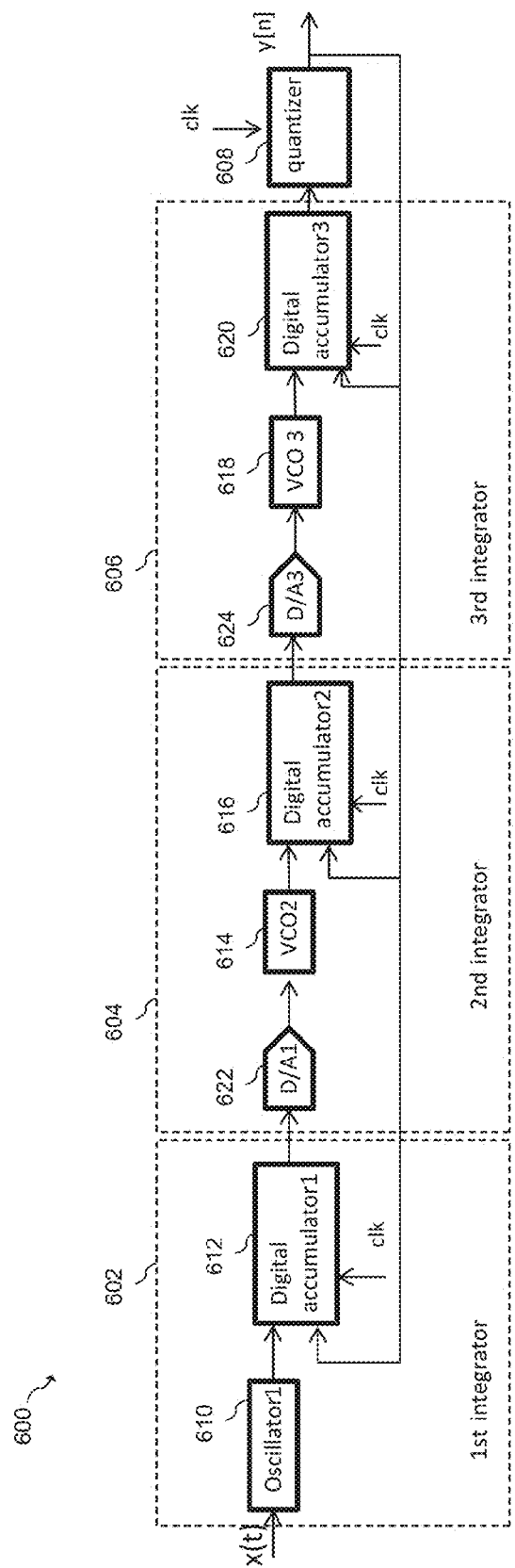
FIG. 16 illustrates a block diagram of an embodiment modulator.

FIG. 16 shows the architecture of a third order sigma delta modulator 600 employing an architecture based on VCOs and digital logic. Modulator 600 includes a first integrator having oscillator 610 and digital accumulator 612 that operate according to embodiments described above. In an embodiment, the analog loop filter is replaced with integrators 604 and 606, each having a VCO 614 and 618 and a digital accumulator 616 and 620, respectively. The output of quantizer 608 may be fed back to one or more of integrators 602, 604 and 606. In some embodiments VCOs 614 and 618 are controlled via digital to analog converters (D/A) 622 and 624, respectively. Alternatively, voltage controller oscillators 614 and 618 may be replaced by digitally controlled oscillators (DCO) and the D/A converters may be eliminated. It should be understood that modulator 600 may be implemented using only integrators 602 and 604, or using by additional integrators cascaded after integrator 606.

In accordance with an embodiment, a circuit includes an oscillator having an oscillation frequency dependent on an input signal, a digital accumulator having a first input coupled to an output of the oscillator, a digital-to-analog converter (DAC) coupled to an output of the digital accumulator, an analog loop filter coupled to an output of the digital-to-analog converter, and a comparison circuit having an input coupled to an output of the analog loop filter and an output coupled to a second input of the digital accumulator. In various embodiments, the input signal may include a sound signal. The oscillator may be configured to be coupled to a MEMS microphone, such that the oscillator frequency is dependent on a capacitance of the MEMS microphone.

In an embodiment, the digital accumulator is configured to increment in a first direction when the output of the oscillator undergoes a logic transition, and the digital accumulator is configured to increment in a second direction opposite the first direction when the output of the comparison circuit is in a first logic state. The digital accumulator may be configured to increment a first amount in the second direction when the output of the comparison circuit is in the first logic state, and may be configured to increment a second amount in the second direction when the output of the comparison circuit is in a second logic state.

In some embodiments, the digital accumulator is configured to asynchronously increment in the first direction when the output of the oscillator undergoes a logic transition, and is configured to synchronously transition in the second direction at an edge of a clock signal having a fixed frequency when the output of the comparison circuit is in the first state. The digital accumulator may include a first ring counter configured to asynchronously increment when the output of the oscillator undergoes a logic transition, and a second ring counter configured to increment when the output of the comparison circuit is in a first state.

In an embodiment, the DAC includes a plurality of first current sources, each of which has a control input coupled to a corresponding output bit of the first ring counter and the output of the DAC. Each of the plurality of first current sources further has a first current polarity. The DAC also includes a plurality of second current sources that have a control input coupled to a corresponding output bit of the second ring counter and the output of the DAC. Each of the plurality of second current sources has a second current polarity that is opposite the first current polarity.

In an embodiment, the analog loop filter includes an integrator that may have an order of at least two. The circuit may further include a digital decimator having an input coupled to the output of the comparison circuit. In various embodiments, the comparison circuit includes a comparator that may be implemented as a single-bit comparator or as a multibit comparator.

In accordance with a further embodiment, an integrated circuit includes an oscillator core circuit, a digital-to-analog converter (DAC), an analog loop filter and a comparator. The oscillator core circuit includes an interface configured to be coupled to a capacitive sensing element, and the oscillator core circuit is configured to provide an oscillation signal having a frequency dependent on a capacitance of the capacitive sensing element. The digital accumulator has a first input coupled to an output of the oscillator, the digital-to-analog DAC is coupled to an output of the digital accumulator, the analog loop filter is coupled to an output of the digital-to-analog converter, and the comparator has an input coupled to an output of the analog loop filter and an output coupled to a second input of the digital accumulator. In an embodiment, the integrated circuit further includes the capacitive sensing element, which may include, for example, a MEMS microphone sensor. The integrated circuit may also include a decimator coupled to the output of the comparator.

In an embodiment, the digital accumulator is configured to asynchronously change state in a first manner when the output of the oscillator core circuit undergoes a logic transition, and the digital accumulator is configured to synchronously change state in a second manner at an edge of a clock signal having a fixed frequency when the output of the comparator is in a first state. The digital accumulator may include a first ring counter configured to asynchronously increment when the output of the oscillator core circuit undergoes a logic transition, and a second ring counter configured to increment when the output of the comparator is in a first state.

In an embodiment, the DAC includes a plurality of first current sources. Each of the plurality of first current sources has a control input coupled to a corresponding output bit of the first ring counter and the output of the DAC, and each of the plurality of first current sources has a first current polarity. The DAC further includes a plurality of second current sources. Each of the plurality of first current sources has a control input coupled to a corresponding output bit of the second ring counter and the output of the DAC, and each of the plurality of second current sources has a second current polarity that is opposite the first current polarity.

In accordance with a further embodiment, a method of performing an analog to digital conversion includes generating an oscillating signal having a frequency that depends on an input signal, controlling an accumulator based on an edge of the oscillating signal and based on a comparison signal, performing a digital-to-analog conversion of an output of the accumulator to produce a first analog signal, filtering the first analog signal using an analog loop filter, and comparing an output of the analog loop filter with a threshold to produce the comparison signal. Generating the oscillating signal may include using an oscillator circuit. In some embodiments, the input signal includes a sound signal, and the frequency is dependent on a capacitance of a capacitive sound sensor. The method may further include decimating the comparison signal to produce a data converter output signal.

In an embodiment, controlling the accumulator incrementing the accumulator in a first direction when the oscillating signal undergoes a state transition, and incrementing the accumulator in a second direction opposite the first direction when the comparison signal is in a first state. Incrementing the accumulator in a second direction may include incrementing the accumulator in the second direction at a clock signal edge of a clock having a fixed frequency when the comparison signal in the first state. In some embodiments, controlling the accumulator may include asynchronously incrementing a first ring counter when the output of the oscillator undergoes a logic transition, and incrementing a second ring counter at an edge of a fixed clock when the comparison signal is in a first state. In an embodiment, filtering the first analog signal includes performing an analog integration of an output of the DAC.

In accordance with a further embodiment, a MEMS sensor interface includes an oscillator core circuit having an interface configured to be coupled to a MEMS sensing element, such that the oscillator core circuit is configured to provide an oscillation signal having a frequency dependent on a capacitance of the MEMS sensing element. The MEMS sensor interface further includes a digital accumulator that has a first input coupled to an output of the oscillator and a second input. The digital accumulator includes a first ring counter configured to asynchronously increment when the output of the oscillator core circuit undergoes a logic transition, and a second ring counter configured to increment at the transition of a fixed frequency clock when second input is in a first state. The MEMS sensor interface further includes a digital-to-analog converter (DAC) coupled to an output of the digital accumulator that includes a plurality of first current sources and second current source. Each of the plurality of first current sources has a control input coupled to a corresponding output bit of the first ring counter and an output of the DAC, and each of the plurality of first current sources has a first current polarity. Similarly, each of the plurality of second current sources has a control input coupled to a corresponding output bit of the second ring counter and the output of the DAC, and each of the plurality of second current sources has a second current polarity that is opposite the first current polarity. The MEMS sensor interface also includes an analog loop filter coupled to an output of the digital-to-analog converter, and a comparator having an input coupled to an output of the analog loop filter and an output coupled to a second input of the digital accumulator. In an embodiment, the MEMS sensor interface also includes a decimation filter coupled to the output of the comparator.

In an embodiment, a circuit includes a first stage, a second stage and a comparison circuit. The first stage includes a first oscillator having an oscillation frequency dependent on an input signal, and a first digital accumulator having a first input coupled to an output of the first oscillator. The second stage includes a second oscillator having an oscillation frequency dependent on an output of the first digital accumulator, and a second digital accumulator having a first input coupled to an output of the second oscillator. The comparison circuit has an input coupled to an output of the second stage and an output coupled to a second input of the first digital accumulator.

In an embodiment, the circuit further includes a third stage coupled between the second stage and the comparison circuit. The third stage may include a third oscillator having an oscillation frequency dependent on an output of the second digital accumulator, and a third digital accumulator having a first input coupled to an output of the third oscillator. In some embodiment, the output of the comparison circuit is further coupled to a first input of the second digital accumulator and a first input of the third digital accumulator. The second oscillator may be implemented using a digital to analog converter, and a voltage controlled oscillator coupled to an output of the digital to analog converter. Alternatively, the second oscillator may be implemented using a digitally controlled oscillator (DCO).

An advantage of embodiment systems includes insensitivity of clock jitter and feedback DAC mismatch. A further advantage of some embodiments includes the ability to provide noise shaping of analog circuit errors using a digital accumulator to perform a first integration instead of a high performance analog integrator.

A further advantage to some embodiments include the ability to operate the MEMS microphone in an unbiased condition, as doing so increases peak audio sound level detectable by the MEMS microphone, as well as saving power and die area that would normally be devoted to bias the MEMS microphone.

Another advantage of some embodiments includes the ability to implement a capacitive data converter without analog integrators by replacing all analog integrators with oscillators and counters.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    an oscillator having an oscillation frequency dependent on an input signal;
    a digital accumulator having a first input coupled to an output of the oscillator;
    a digital-to-analog converter (DAC) coupled to an output of the digital accumulator;
    an analog loop filter coupled to an output of the digital-to-analog converter; and
    a comparison circuit having an input coupled to an output of the analog loop filter, and an output coupled to a second input of the digital accumulator.

2. The circuit of claim 1, wherein the input signal comprises a sound signal.

3. The circuit of claim 1, wherein:
    the oscillator is configured to be coupled to a MEMS microphone; and
    the oscillator frequency is dependent on a capacitance of the MEMS microphone.

4. The circuit of claim 1, wherein:
    the digital accumulator is configured to increment in a first direction when the output of the oscillator undergoes a logic transition; and
    the digital accumulator is configured to increment in a second direction opposite the first direction when the output of the comparison circuit is in a first logic state.

5. The circuit of claim 4, wherein:
    the digital accumulator is configured to increment a first amount in the second direction when the output of the comparison circuit is in the first logic state; and
    the digital accumulator is configured to increment a second amount in the second direction when the output of the comparison circuit is in a second logic state.

6. The circuit of claim 4, wherein:
    the digital accumulator is configured to asynchronously increment in the first direction when the output of the oscillator undergoes a logic transition; and
    the digital accumulator is configured to synchronously transition in the second direction at an edge of a clock signal having a fixed frequency when the output of the comparison circuit is in the first state.

7. The circuit of claim 1, wherein the digital accumulator comprises:
    a first ring counter configured to asynchronously increment when the output of the oscillator undergoes a logic transition; and
    a second ring counter configured to increment when the output of the comparison circuit is in a first state.

8. The circuit of claim 7, wherein the DAC comprises:
    a plurality of first current sources, wherein each of the plurality of first current sources has a control input coupled to a corresponding output bit of the first ring counter and the output of the DAC, and each of the plurality of first current sources has a first current polarity; and
    a plurality of second current sources, wherein each of the plurality of first current sources has a control input coupled to a corresponding output bit of the second ring counter and the output of the DAC, and each of the plurality of second current sources has a second current polarity that is opposite the first current polarity.

9. The circuit of claim 1, wherein the analog loop filter comprises an integrator.

10. The circuit of claim 1, wherein the analog loop filter comprises an order of at least two.

11. The circuit of claim 1, further comprising a digital decimator having an input coupled to the output of the comparison circuit.

12. The circuit of claim 1, wherein the comparison circuit comprises a comparator.

13. The circuit of claim 12, wherein the comparator comprises a multibit comparator.

14. An integrated circuit comprising:
    an oscillator core circuit comprising an interface configured to be coupled to a capacitive sensing element, wherein the oscillator core circuit is configured to provide an oscillation signal having a frequency dependent on a capacitance of the capacitive sensing element;
    a digital accumulator having a first input coupled to an output of the oscillator;
    a digital-to-analog converter (DAC) coupled to an output of the digital accumulator;
    an analog loop filter coupled to an output of the digital-to-analog converter; and
    a comparator having an input coupled to an output of the analog loop filter, and an output coupled to a second input of the digital accumulator.

15. The integrated circuit of claim 14, further comprising the capacitive sensing element.

16. The integrated circuit of claim 14, wherein the capacitive sensing element comprises a MEMS microphone sensor.

17. The integrated circuit of claim 14, wherein:
    the digital accumulator is configured to asynchronously change state in a first manner when the output of the oscillator core circuit undergoes a logic transition; and
    the digital accumulator is configured to synchronously change state in a second manner at an edge of a clock signal having a fixed frequency when the output of the comparator is in a first state.

18. The integrated circuit of claim 14, wherein the digital accumulator comprises:
    a first ring counter configured to asynchronously increment when the output of the oscillator core circuit undergoes a logic transition; and
    a second ring counter configured to increment when the output of the comparator is in a first state.

19. The integrated circuit of claim 18, wherein the DAC comprises:
    a plurality of first current sources, wherein each of the plurality of first current sources has a control input coupled to a corresponding output bit of the first ring counter and the output of the DAC, and each of the plurality of first current sources has a first current polarity; and
    a plurality of second current sources, wherein each of the plurality of first current sources has a control input coupled to a corresponding output bit of the second ring counter and the output of the DAC, and each of the plurality of second current sources has a second current polarity that is opposite the first current polarity.

20. The integrated circuit of claim 14, further comprising a decimator coupled to the output of the comparator.

21. A method of performing an analog to digital conversion, the method comprising:
generating an oscillating signal having a frequency that depends on an input signal, wherein generating the oscillating signal comprises using an oscillator circuit;
controlling an accumulator based on an edge of the oscillating signal and based on a comparison signal;
performing a digital-to-analog conversion of an output of the accumulator to produce a first analog signal;
filtering the first analog signal using an analog loop filter; and
comparing an output of the analog loop filter with a threshold to produce the comparison signal.

22. The method of claim 21, wherein:
the input signal comprises a sound signal; and
the frequency is dependent on a capacitance of a capacitive sound sensor.

23. The method of claim 21, wherein controlling the accumulator comprises:
incrementing the accumulator in a first direction when the oscillating signal undergoes a state transition; and
incrementing the accumulator in a second direction opposite the first direction when the comparison signal is in a first state.

24. The method of claim 23, wherein incrementing the accumulator in a second direction comprises incrementing the accumulator in the second direction at a clock signal edge of a clock having a fixed frequency when the comparison signal in the first state.

25. The method of claim 21, wherein controlling the accumulator comprises:
asynchronously incrementing a first ring counter when the output of the oscillator undergoes a logic transition; and
incrementing a second ring counter at an edge of a fixed clock when the comparison signal is in a first state.

26. The method of claim 21, wherein filtering the first analog signal comprises performing an analog integration of the first analog signal.

27. The method of claim 21, further comprising decimating the comparison signal to produce a data converter output signal.

28. A MEMS sensor interface comprising:
oscillator core circuit comprising an interface configured to be coupled to a MEMS sensing element, wherein the oscillator core circuit is configured to provide an oscillation signal having a frequency dependent on a capacitance of the MEMS sensing element;
a digital accumulator having a first input coupled to an output of the oscillator and a second input, the digital accumulator comprising
a first ring counter configured to asynchronously increment when the output of the oscillator core circuit undergoes a logic transition, and
a second ring counter configured to increment at the transition of a fixed frequency clock when second input is in a first state;

a digital-to-analog converter (DAC) coupled to an output of the digital accumulator, the DAC comprising:
a plurality of first current sources, wherein each of the plurality of first current sources has a control input coupled to a corresponding output bit of the first ring counter and an output of the DAC, and each of the plurality of first current sources has a first current polarity; and
a plurality of second current sources, wherein each of the plurality of first current sources has a control input coupled to a corresponding output bit of the second ring counter and the output of the DAC, and each of the plurality of second current sources has a second current polarity that is opposite the first current polarity;
an analog loop filter coupled to an output of the digital-to-analog converter; and
a comparator having an input coupled to an output of the analog loop filter, and an output coupled to a second input of the digital accumulator.

29. The MEMS sensor interface of claim 28, further comprising a decimation filter coupled to the output of the comparator.

30. A circuit comprising:
a first stage comprising
a first oscillator having an oscillation frequency dependent on an input signal, and
a first digital accumulator having a first input coupled to an output of the first oscillator;
a second stage comprising:
a second oscillator having an oscillation frequency dependent on an output of the first digital accumulator, and
a second digital accumulator having a first input coupled to an output of the second oscillator; and
a comparison circuit having an input coupled to an output of the second stage and an output coupled to a second input of the first digital accumulator.

31. The circuit of claim 30, further comprising a third stage coupled between the second stage and the comparison circuit, wherein the third stage comprises:
a third oscillator having an oscillation frequency dependent on an output of the second digital accumulator, and
a third digital accumulator having a first input coupled to an output of the third oscillator.

32. The circuit of claim 31, wherein the output of the comparison circuit is further coupled to a first input of the second digital accumulator and a first input of the third digital accumulator.

33. The circuit of claim 30, wherein the second oscillator comprises
a digital to analog converter; and
a voltage controlled oscillator coupled to an output of the digital to analog converter.

34. The circuit of claim 30, wherein the second oscillator comprises a digitally controlled oscillator (DCO).

* * * * *